(12) United States Patent
Ansems et al.

(10) Patent No.: US 11,739,907 B2
(45) Date of Patent: Aug. 29, 2023

(54) LIGHT EMITTING DEVICE FOR USE IN A LIGHT EMITTING PANEL

(71) Applicant: SIGNIFY HOLDING B.V., Eindhoven (NL)

(72) Inventors: Johannes Petrus Maria Ansems, Hulsel (NL); Michel Cornelis Josephus Marie Vissenberg, Roermond (NL); Peter Johannes Martinus Bukkems, Deurne (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/801,746

(22) PCT Filed: Feb. 22, 2021

(86) PCT No.: PCT/EP2021/054292
§ 371 (c)(1),
(2) Date: Aug. 23, 2022

(87) PCT Pub. No.: WO2021/170528
PCT Pub. Date: Sep. 2, 2021

(65) Prior Publication Data
US 2023/0077292 A1    Mar. 9, 2023

(30) Foreign Application Priority Data

Feb. 24, 2020   (EP) .................................... 20158996

(51) Int. Cl.
*F21V 5/00* (2018.01)
*F21Y 115/10* (2016.01)

(52) U.S. Cl.
CPC ............. *F21V 5/00* (2013.01); *F21Y 2115/10* (2016.08)

(58) Field of Classification Search
CPC .............................. F21V 5/00; F21Y 2115/10
See application file for complete search history.

(56) References Cited

U.S. PATENT DOCUMENTS

| 8,946,978 B2 | 2/2015 | Ansems et al. |
| 9,062,830 B2 | 6/2015 | Le et al. |

(Continued)

FOREIGN PATENT DOCUMENTS

| CN | 1848462 A | 10/2006 |
| CN | 202469601 U | 10/2012 |

(Continued)

*Primary Examiner* — Evan P Dzierzynski

(57) ABSTRACT

The present invention relates to a light emitting device comprising one or more LED light sources and one or more diffusely transmissive covers. The one or more diffusely transmissive covers extend over the one or more LED light sources to form one or more combinations of an LED light source and a diffusely transmissive cover. For each combination of an LED light source and a diffusely transmissive cover (i) the diffusely transmissive cover is dome-shaped with a vertical cross-section having a closed convex shape and a horizontal cross-section having a polygonal shape, (ii) the diffusely transmissive cover has a width (w) projected in a horizontal plane parallel to a bottom of the diffusely transmissive cover, (iii) the LED light source has a distance (d) to any neighboring LED light source. The width (w) and the distance (d) are perpendicular to each other, and the ratio of the width (w) and the distance (d) is constant.

12 Claims, 6 Drawing Sheets

(56) References Cited

U.S. PATENT DOCUMENTS

| | | | |
|---|---|---|---|
| 9,546,765 B2 | 1/2017 | Dai et al. | |
| 2008/0101063 A1* | 5/2008 | Koike | F21V 29/89 |
| | | | 362/231 |
| 2008/0308825 A1 | 12/2008 | Chakraborty et al. | |
| 2009/0065792 A1 | 3/2009 | Thompson et al. | |
| 2011/0075428 A1* | 3/2011 | Chen | G02B 19/0014 |
| | | | 362/311.02 |
| 2014/0146546 A1 | 5/2014 | Yamada et al. | |
| 2014/0173885 A1* | 6/2014 | Lai | H05K 3/303 |
| | | | 29/593 |
| 2015/0109559 A1* | 4/2015 | Lee | G02F 1/133603 |
| | | | 349/67 |

FOREIGN PATENT DOCUMENTS

| | | |
|---|---|---|
| CN | 205480345 U | 8/2016 |
| JP | 2010044922 A | 2/2010 |
| KR | 20090017346 A | 2/2009 |
| WO | 2007121486 A2 | 10/2007 |
| WO | 2008022064 A2 | 2/2008 |
| WO | 2012085853 A1 | 6/2012 |
| WO | 2013045253 A1 | 4/2013 |
| WO | 2013056516 A1 | 4/2013 |
| WO | 2015095189 A1 | 6/2015 |

* cited by examiner

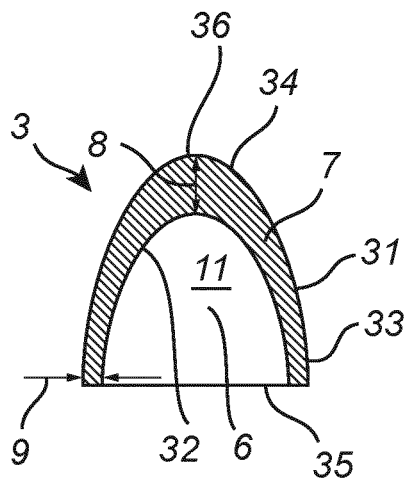
Fig. 3
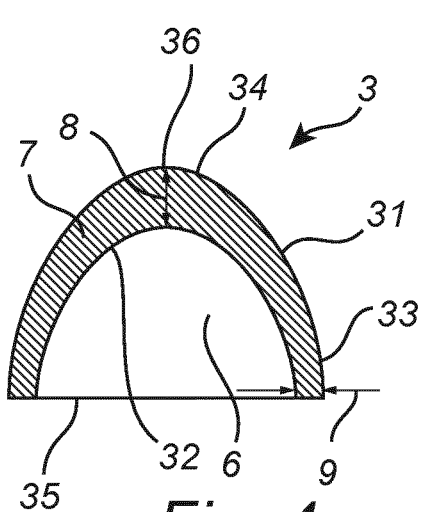
Fig. 4
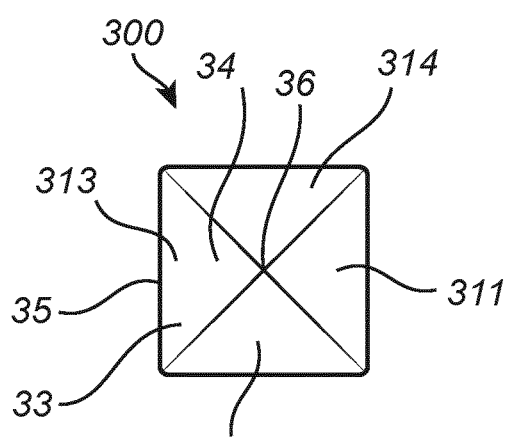
Fig. 5
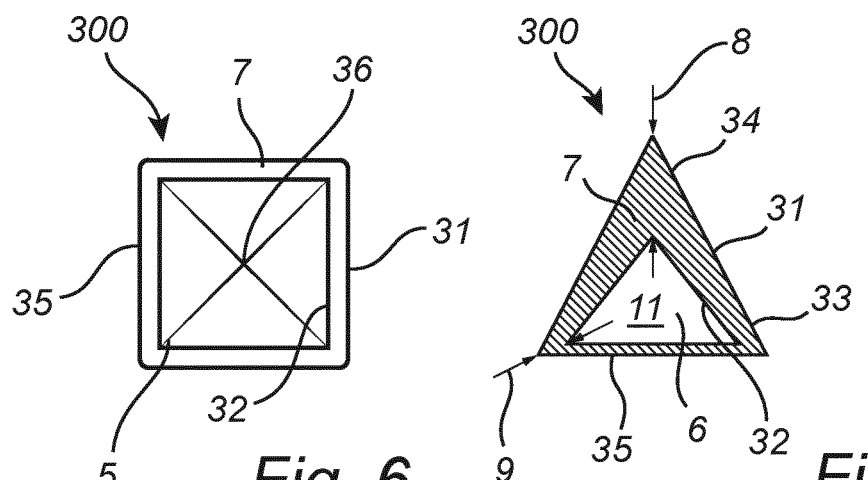
Fig. 6
Fig. 7

LIGHT EMITTING DEVICE FOR USE IN A LIGHT EMITTING PANEL

CROSS-REFERENCE TO PRIOR APPLICATIONS

This application is the U.S. National Phase application under 35 U.S.C. § 371 of International Application No. PCT/EP2021/054292, filed on Feb. 22, 2021, which claims the benefit of European Patent Application No. 20158996.7, filed on Feb. 24, 2020. These applications are hereby incorporated by reference herein.

FIELD OF THE INVENTION

The invention relates to a light emitting device for use in a light emitting panel such as a wall panel or a ceiling panel.

BACKGROUND OF THE INVENTION

Relatively large light emitting wall panels or ceiling panels can be used to illuminate a space. Using different kind of fabrics or materials, a certain mood or certain design features can be obtained. For all such applications it is important that the front side of the panel is homogeneously illuminated.

Nowadays most of such panels are illuminated by using a large square array of LEDs and using a relatively large distance to the front fabric. Square arrays of LEDs are used to avoid so-called side wall effects. However, there is a need in the market for panels with a lower building height while still being homogeneously illuminated.

The fulfill this need one may decrease the LED pitch, but this has a drawback in that it is not cost effective. Alternatively, one may use light guides for light spreading, but this has a drawback in that it may not be allowed for fire safety reasons.

Another option is to use side emitting optics as known in the field of back lighting. However, this requires accurate positioning of such optics with respect to the positions of the LEDs, which is expensive. Also, panels that are color tunable or colored using multiple LEDs with different color together with one side emitting lens will give undesired color over angle effects.

Using scattering optics (such as diffusely transmissive domes, cones, or ellipsoids) is yet another possibility for making a homogeneous illuminated panel. This will make the optics less critical in positioning and tolerance and gives better color mixing. However, because the effect on uniformity is limited this option is considered inferior to the other above-mentioned options.

CN 1848462 A describes a single or several LED chips fixed on an electronic circuit board and covered with a prefabricated shell or cover body. The shell or cover body is fixed on the electronic circuit board, or the electronic circuit board is fixed on a fixing seat. The periphery of the electronic circuit board is also covered with the shell or cover body, so that the direction, angle and color of light source can be easily changed and replaced, and at the same time a better radiating effect is obtained. The shell or cover body is made of a light transmissive material. As regards the shape of the shell or cover body, CN 1848462 A only describes that it can be provided with various shapes, such as a cylinder, a hemisphere, a square and a plane.

SUMMARY OF THE INVENTION

There is a demand for providing a uniformly lit large area panel with a relatively low LED count such as to keep costs low, with a relatively low plastic area for fire safety reasons, a forgiving positioning tolerance of the optical component, and no color artefacts.

It is an object of the present invention to fulfill this demand, and to provide a light emitting device that enables the aforementioned large area panel.

According to a first aspect of the invention, the object is achieved by means of a light emitting device comprising one or more LED light sources and one or more diffusely transmissive covers. The one or more diffusely transmissive covers extend over the one or more LED light sources to form one or more combinations of an LED light source and a diffusely transmissive cover.

For each combination of an LED light source and a diffusely transmissive cover (i) the diffusely transmissive cover is dome-shaped with a vertical cross-section having a closed convex shape and a horizontal cross-section having a polygonal shape, (ii) the diffusely transmissive cover has a width (w) projected in a horizontal plane parallel to a bottom of the diffusely transmissive cover, (iii) the LED light source has a distance (d) to any neighboring LED light source. The width (w) and the distance (d) are perpendicular to each other, and the ratio of the width (w) and the distance (d) is constant.

In the context of the present invention, the term "LED light source" should be interpreted to refer to a single LED or to a cluster of two or more LEDs, such as a cluster of red, green, blue and white (RGBW) LEDs.

The one or more LED light sources may be arranged in an array of LED light sources, and the one or more diffusely transmissive covers may be arranged in an array of diffusely transmissive covers.

By providing each diffusely transmissive cover with a vertical cross-section comprising a closed convex shape and a polygonal horizontal cross-section, a significant improvement in the illuminance uniformity of the light output of the light emitting device measured at a distance from the array of LED light sources may be obtained.

By further providing that the width (w) of the diffusely transmissive cover projected in a horizontal plane at a bottom of the diffusely transmissive cover and the distance (d) from one LED light source to a neighboring LED light source in the array of LED light sources are chosen such that the ratio w/d is constant, it is ensured that more light is projected from any given LED light source in the direction towards a neighboring LED light source being farther away than to neighboring LED light sources being closer to the said given LED light source. Thereby, a further improvement in the illuminance uniformity of the light output of the light emitting device measured at a distance from the array of LED light sources may be obtained.

Thereby, a light emitting device is provided which enabling providing a uniformly lit large area panel, with a relatively low LED count such as to keep cost low, relatively low cover area for fire safety reasons, a forgiving positioning tolerance of the optical component, and no color artefacts.

In the light emitting device, each diffusely transmissive cover extends over an LED light source. Thereby a light emitting device is provided which is particularly simple to scale up to any required size, while still achieving the above advantages and thus without compromising the illuminance uniformity.

Each of the diffusely transmissive covers comprises a wall with a thickness, and the thickness may vary with the height of the wall and/or over the circumference of the wall. Thereby, the direction of light emission may be controlled and a further optimization of the illuminance uniformity of the light output of the light emitting device may be obtained.

Each diffusely transmissive cover comprises a wall with a top section, a bottom section and a thickness, and the thickness may be larger at the top section than at the bottom section. Thereby, an even further optimization of illuminance uniformity of the light output of the light emitting device may be obtained, while also promoting side-emission of light from the domes over top-emission.

Each diffusely transmissive cover may comprise a wall with an apex, a bottom and a thickness, wherein the thickness is largest at the apex and smallest at the bottom. Thereby, a particularly efficient optimization of illuminance uniformity of the light output of the light emitting device may be obtained, while also optimizing the promotion of side-emission of light from the domes over top-emission.

The horizontal cross sections of the dome-shaped diffusely transmissive covers may be quadrilateral, pentagonal or hexagonal. Such a shape of the horizontal cross-section has been shown to yield a particularly good illuminance uniformity of the light output of the light emitting device.

The vertical cross-sections of the dome-shaped diffusely transmissive covers may be spline-shaped, ellipsoid, triangular or hemi-ellipsoid. Such shaped vertical cross-sections have been shown to yield a particularly good illuminance uniformity of the light output of the light emitting device.

Each diffusely transmissive cover may be pyramid-shaped or hemi-ellipsoid. Such a shape of the individual covers of the array of covers has been shown to yield a particularly good illuminance uniformity of the light output of the light emitting device.

The horizontal cross sections at a bottom of each diffusely transmissive cover may have a side length in a range of 5 millimeters to 16 millimeters, such as 11 millimeters. These exemplary side lengths are especially suitable for embodiments in which each cover covers an LED light source with one or two LEDs. Thereby, the light emitting device is provided with a relation between the size of the bases of the cover and the LED light source, respectively, providing a further improvement of the illuminance uniformity of the light output of the light emitting device.

The wall of each diffusely transmissive cover has a top section, a bottom section and a thickness. The thickness of the wall at the bottom section may be in a range of 0.4 millimeters to 1.2 mm, such as 1 millimeter, and the thickness of the wall at the top section may be in a range of 1.5 millimeters to 4 millimeters, such as 2.5 millimeters. Thereby, optimization of illuminance uniformity of the light output of the light emitting device may be obtained.

The horizontal cross sections of the diffusely transmissive covers may conform to the shape of a base of each LED light source in the array of LED light sources. It has been shown by the inventors that providing the light emitting device with a shape of the bases of the cover and the LED light sources, respectively, being identical or conforming to one another, provides an optimum illuminance homogeneity of the light output of the light emitting device.

The horizontal cross section of any one of each diffusely transmissive cover and the array of diffusely transmissive covers may conform to the shape of the array of LED light sources. It has been shown by the inventors that providing the light emitting device with a shape of the base of the cover and the overall shape of the array of LED light sources, respectively, being identical or conforming to one another, provides an optimum illuminance homogeneity of the light output of the light emitting device.

Each diffusely transmissive cover has a height, and the height may be equal to or less than 20 millimeters, such as 11.2 millimeters. Generally, however, the height is chosen in dependence of the height of the chamber of the fabric and the number of LED light sources arranged within each cover.

Each diffusely transmissive cover may be made of a glass material or of a plastic material, in each case with or without a scattering material. Glass and plastic materials provide for covers being both sufficiently diffusely transmissive and robust, thereby providing a robust light emitting device. Glass materials have the further advantage of being fireproof. The addition of a scattering material has the advantage of providing for a robustness in relation to positioning and color mixing.

The light emitting device may be configured to be used as a light emitting wall panel or as a light emitting ceiling panel.

In a second aspect the invention concerns a light emitting panel comprising a light emitting device according to the first aspect of the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIGS. 3 and 4 show two different cross-sectional side views, that of FIG. 4 being rotated 45 degrees with respect to that of FIG. 3, of a cover of the light emitting device according to FIG. 1.

FIGS. 5 to 7 show a top view, a bottom view and a cross-sectional side view, respectively, of another embodiment of a cover of a light emitting device according to the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION OF THE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
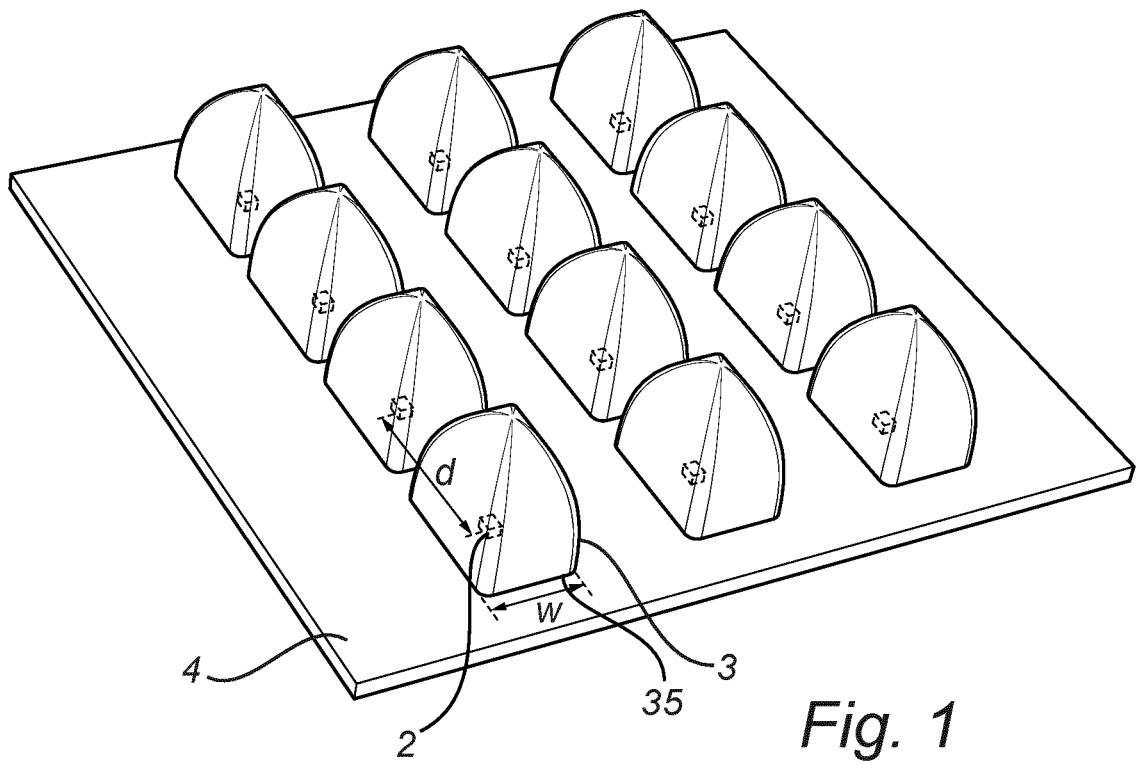
FIG. 1 shows a perspective schematic view of a light emitting device according to the invention comprising an array of LED light sources and a corresponding array of covers.

FIG. 1 shows a perspective view of a light emitting device 1 according to the invention and for use as a light emitting panel. The light emitting device may be used for any suitable type of panel, and particularly panels having a large surface area, such as wall panels and ceiling panels. Such panels may serve as displays of various kinds, for instance panels intended for simulating a window or an outdoor environment, such as the sky or a scenery.

The light emitting device 1 comprises an array of LED light sources 2 and an array of diffusely transmissive covers 3.

The LED light sources 2 are adapted for, in operation, emitting light. The light emitted by the LED light sources 2 may be of the same color, such as white, or of two or more different colors.

In the light emitting device 1 illustrated in FIG. 1, each LED light source 2 consists of a single LED. Alternatively, the LED light sources may also consist of two or more LEDs.

The arrays may have any feasible size. The size may be chosen according to the application of the light emitting device 1. The size of the arrays may be expressed as containing n*m LED light sources 2 and covers 3, respectively. Furthermore, n may be equal to m, or n may be larger than m, or n may be smaller than m. In the embodiment shown, the array has a size of 4 by 3. The covers 3 are made of a diffusely transmissive material, such as a suitable glass material or a suitable plastic material. The material of the covers 3 may furthermore be scattering or provided with a scattering material.

In the light emitting device 1 illustrated in FIG. 1, the covers 3 are arranged such that each cover 3 extends over a single LED light source 2, and hence over a single LED. Thus, the number of LEDs and the number of covers 3 are the same.

In an alternative configuration, wherein the LED light sources consist of two or more LEDs, the number of covers may be smaller than the number of LEDs, in which case each cover covers two or more LEDs. It is even feasible that all LEDs are covered with a single cover.

The LED light sources 2 and the diffusely transmissive covers 3 may be arranged on a base or substrate 4, such as a printed circuit board.

Figure 2:
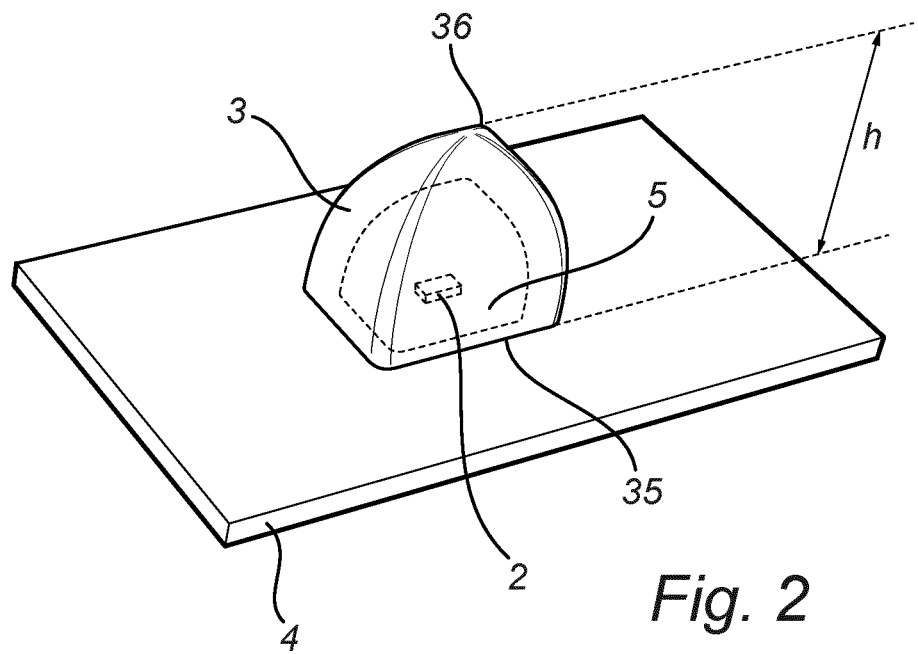
FIG. 2 shows a perspective close-up view of one LED light source with cover of the light emitting device according to FIG. 1.

Referring now also to FIGS. 2-4, each diffusely transmissive cover 3 is dome shaped. Each cover 3 has a vertical cross-section 6 (FIGS. 3 and 4) and a horizontal cross-section 5 (FIG. 2). Generally, the vertical cross-section 6 is elliptical, spline-shaped or triangular and the horizontal cross-section 5 is polygonal. Generally, as shown in FIG. 1, each cover 3 comprises a width w projected in a horizontal plane parallel to bottom 35 of the cover, and the LED light sources 2 are arranged such that each LED light source 2 is arranged in a distance d from a neighboring LED light source 2. The width w and the distance d are perpendicular to one another. The width w may be projected in any horizontal plane parallel to the bottom 35 and located in a height between and including zero and h, where a height of zero is at the bottom 35 and a height h is at the top 36 of the cover 3, as indicated in FIG. 2. Generally, the width w of a given cover 3 covering an LED light source 2 and the distance d from the LED light source 2 covered by the given cover 3 to any neighboring LED light source are chosen such that the ratio w/d is constant, and this relation applies irrespective of the specific height in which the horizontal plane, in which the width w is projected, is extending. This should be understood as applying irrespective of in which direction from the LED light source 2 covered by the given cover 3, the neighboring LED light source is arranged. In the embodiment shown in FIGS. 2-4, the vertical cross-section 6 is elliptical and the horizontal cross-section 5 is rectangular. Each cover 3 further comprises a wall 7 with an outer surface 31, an inner surface 32, a bottom section 33, a top section 34, a bottom 35 and an apex 36.

Each cover 3 further comprises a thickness defined as the distance between and perpendicular to both the outer surface 31 and the inner surface 32. The thickness at the top section 34 of the cover 3 is larger than the thickness at the bottom section 35 of the cover 3. In the embodiment shown in FIGS. 3 and 4, the thickness 8 at the apex 36 of the cover 3 is the largest thickness of the cover 3, while the thickness 9 at the bottom 35 of the cover 3 is the smallest thickness of the cover 3. The thickness of the cover 3 may increase continuously or in increments from the bottom section 33 towards the top section 34, or from the bottom 35 towards the apex 36.

Each cover 3 further comprises a height h (as indicated in FIG. 2) defined as the vertical distance between and perpendicular to the bottom 35 and the apex 36 of the cover 3. The height h may be equal to or less than 20 millimeters. For instance, the height may be 11.2 millimeters. Generally, the height is chosen in dependence of the height of the chamber of the fabric and the number of LEDs arranged within each cover.

FIGS. 5-7 show a top view, a bottom view and a cross-sectional side view, respectively, of an alternative embodiment of a cover 300 of a light emitting device 1 according to the invention. The cover 300 differs from the cover 3 of FIGS. 2-4 in that it is of a generally pyramidal shape. The cover 300 thus comprises a vertical cross-section 6 (FIG. 7) being triangular and a horizontal cross-section 5 (FIG. 6) being polygonal, and more particularly square. The cover 300 further comprises a wall 7 consisting of four identical triangular sides 311, 312, 313 and 314 meeting in an apex 36, as indicated in FIG. 5.

Figure 8:
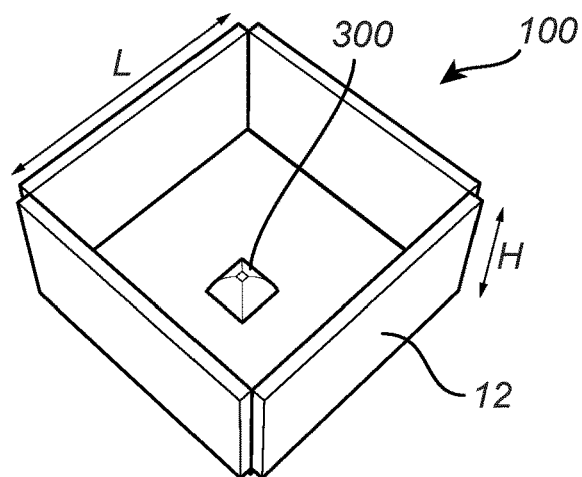
FIG. 8 shows a perspective view of a light emitting device according to the invention comprising a pyramid-shaped scattering cover of a light emitting device according to the invention with a square-shaped horizontal cross-section and a triangular vertical cross section in a square unit cell of an array of LED light sources and associated covers.

Turning now to FIG. 8, a perspective view of an exemplary light emitting device 100 according to the invention is shown. The light emitting device 100 comprises in the embodiment shown an LED light source 2 (not visible in FIG. 8) and a cover 300 generally being of the embodiment shown in FIGS. 5-7. The light emitting device is arranged in a square unit cell 12 with a wall length L of 42.87 millimeters, a height H of 30 millimeters and a reflectivity of 90%. The square unit cell 12 is intended to represent a unit cell of an array of LEDs 2 and associated covers 3 comprising n*m such unit cells 12.

Figure 9A:
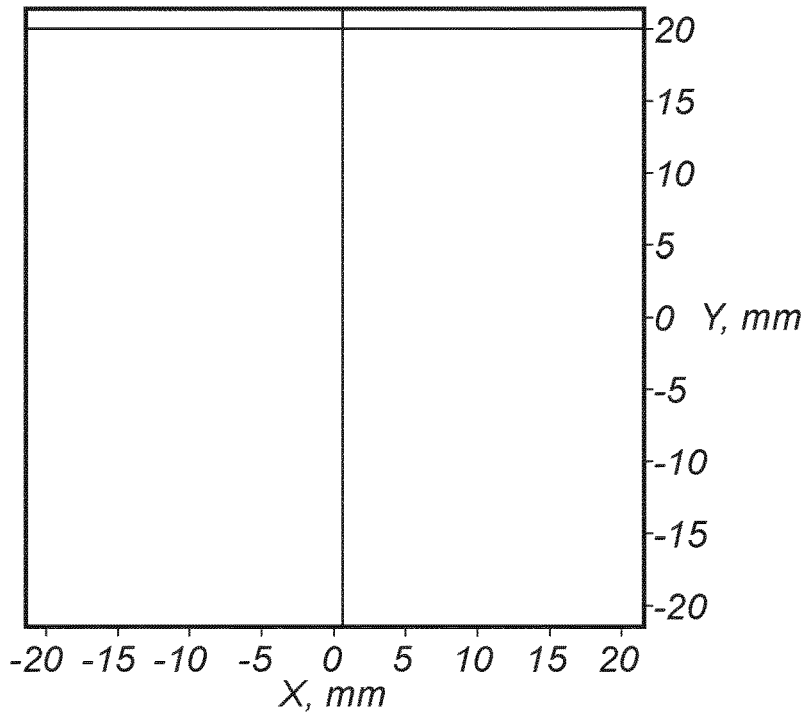
FIGS. 9a-c show graphs illustrating the result of illuminating, with a light emitting device according to FIG. 8, a 20 millimeters by 20 millimeters Lambertian scattering fabric of 30 millimeters height, where graph a) illustrates the illumination of the Lambertian scattering fabric, graph b) shows the cross section of the illuminance of the Lambertian scattering fabric as a function of position in the X-direction indicated on graph a), and graph c) shows the cross section of the illuminance of the Lambertian scattering fabric as a function of position in the Y-direction indicated on graph a).
Figure 9C:
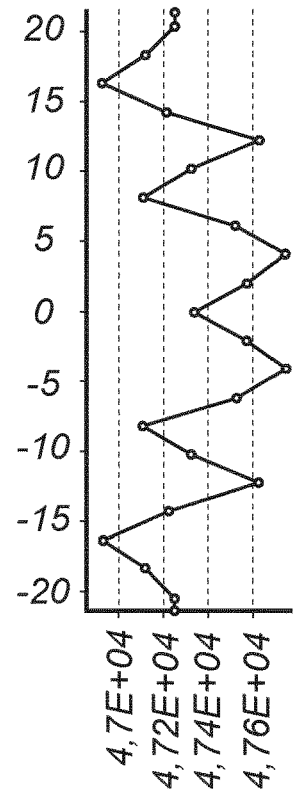
Figure 9B:
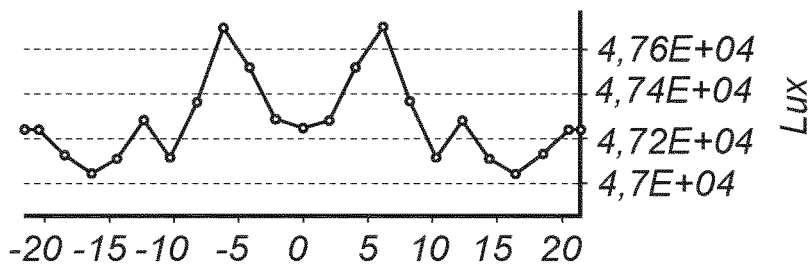

FIG. 9 shows graphs illustrating the result of illuminating, with a light emitting device 100 according to FIG. 8, a Lambertian scattering fabric of 20 millimeters by 20 millimeters with a height of 30 millimeters. To simulate a large array of such unit cells 12, and thus of LED light sources 2 and associated covers 3, the square unit cell 12 is therefore provided with ideal mirrors. Graph a) illustrates the illuminance of a Lambertian scattering fabric. Graph b) shows the illuminance as a function of position in the X-direction indicated on graph a) and graph c) shows the illuminance as a function of position in the Y-direction indicated on graph a). These measurements show that such a light emitting device 100 generates an illuminance with a uniformity of 98%, and that the measured ratio of the lowest illuminance $E_{min}$ and the highest illuminance $E_{max}$ is 0.98.

Figure 13A:
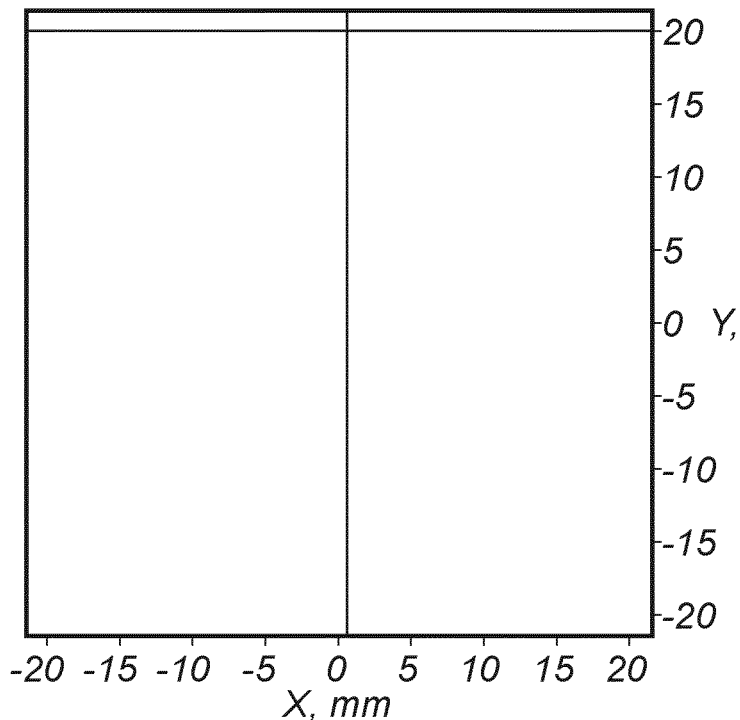
FIGS. 13a-c show graphs illustrating the result of illuminating with a light emitting device according to the invention a Lambertian scattering fabric, where graph a) illustrates the illumination of the Lambertian scattering fabric, graph b) shows the cross section of the illuminance of the Lambertian scattering fabric as a function of position in the X-direction indicated on graph a) and graph c) shows the cross section of the illuminance of the Lambertian scattering fabric as a function of position in the Y-direction indicated on graph a).
Figure 13C:
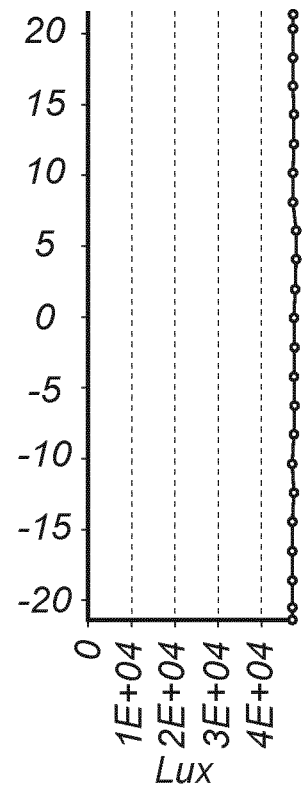
Figure 13B:
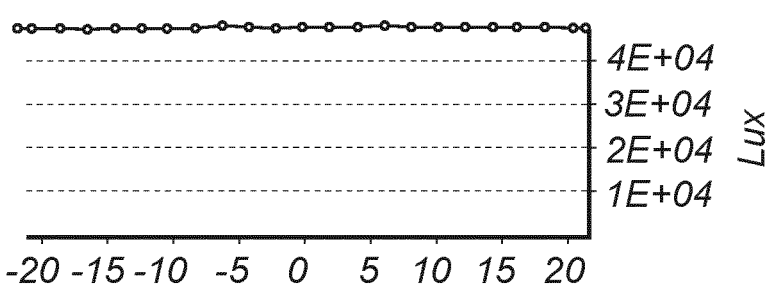

FIG. 13 shows graphs illustrating the result of illuminating with a light emitting device according to another embodiment of the invention a Lambertian scattering fabric. Graph a) illustrates the illumination of the Lambertian scattering fabric. Graph b) shows the cross section of the illuminance of the Lambertian scattering fabric as a function of position in the X-direction indicated on graph a). Graph c) shows the cross section of the illuminance of the Lambertian scattering fabric as a function of position in the Y-direction indicated on graph a). As is clear an illuminance of a very high uniformity, particularly of 98% or above, is obtained.

Figure 10:
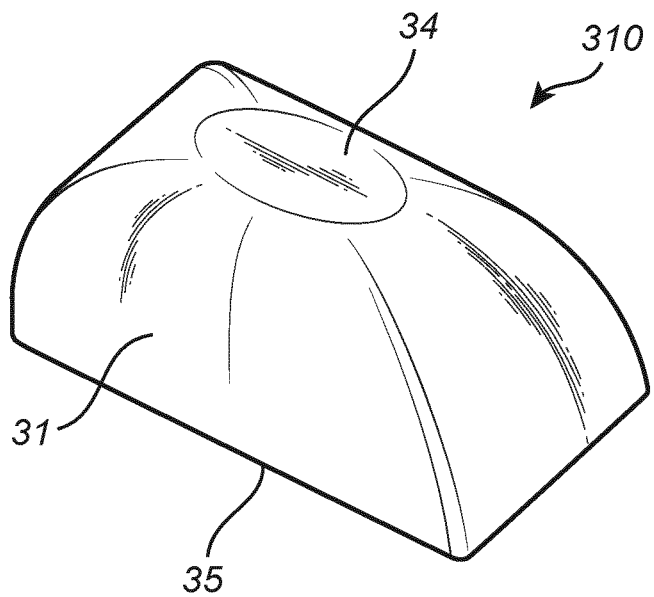
FIG. 10 shows a perspective view of another embodiment of a cover of a light emitting device according to the invention.

FIG. 10 shows a perspective view of another alternative embodiment of a cover 310 of a light emitting device 1 according to the invention. The cover 310 comprises a horizontal cross-section being rectangular. The cover 310 further comprises a vertical cross-section being spline shaped. The cover 310 differs from the cover 3 of FIGS. 2-4 in that it further comprises an elliptical top surface section 34.

Figure 11:
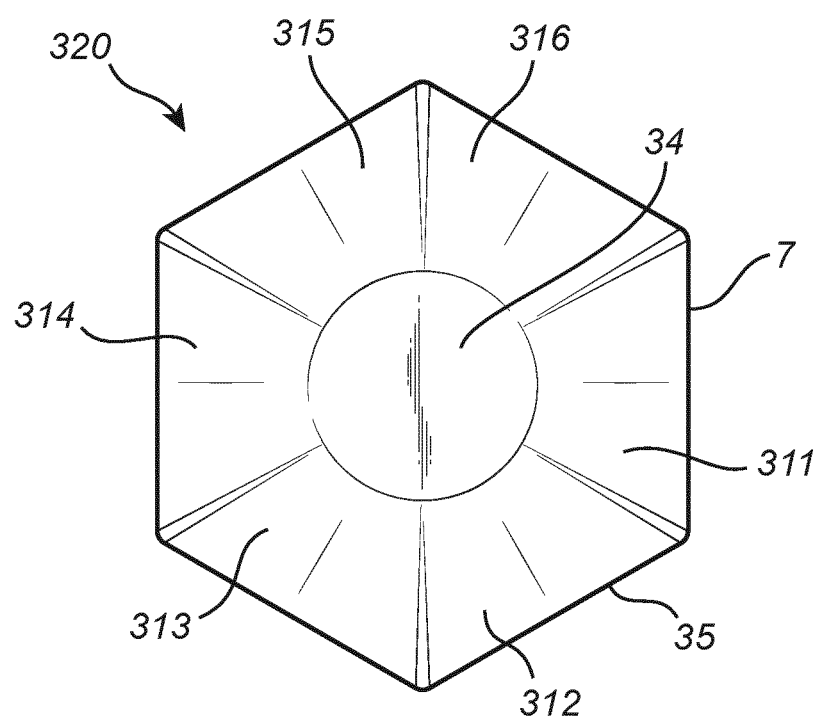
FIGS. 11 and 12 show a top view and a perspective side view, respectively, of another embodiment of a cover of a light emitting device according to the invention.
Figure 12:
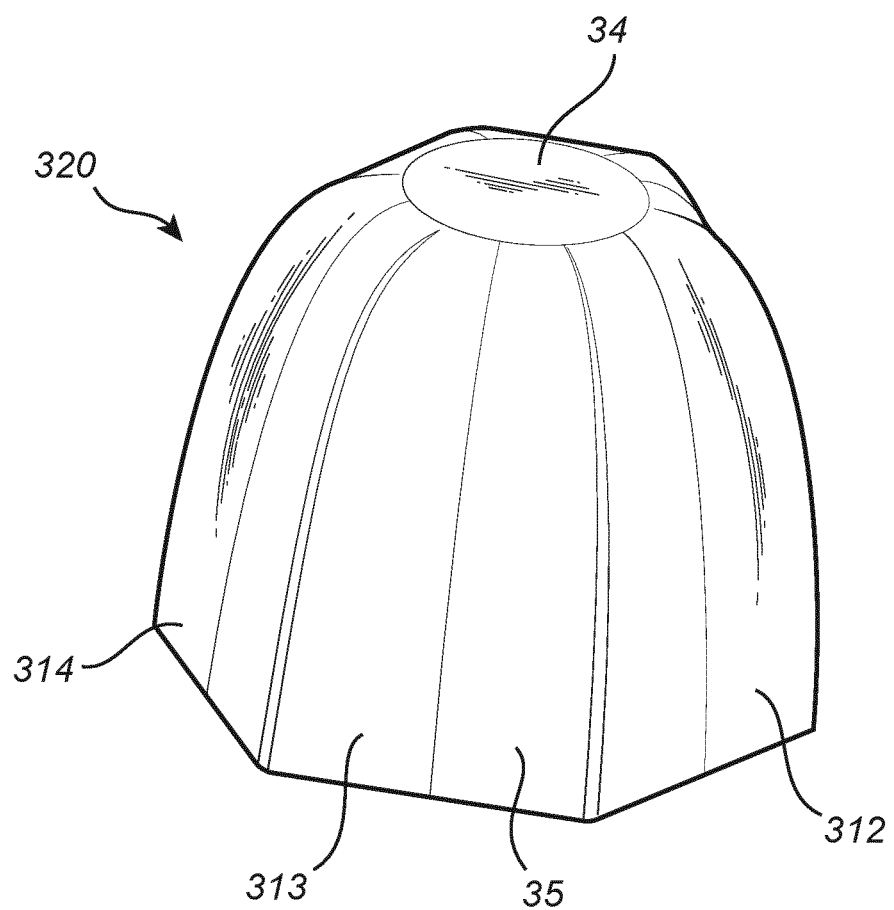

FIGS. 11 and 12 show a top view and a perspective view, respectively, of yet another alternative embodiment of a cover 320 of a light emitting device 1 according to the invention. The cover 320 differs from the cover 3 of FIGS. 2-4 in that it comprises a horizontal cross-section being hexagonal. The cover 320 further comprises a vertical cross-section being spline shaped. The cover 320 further comprises a wall 7 consisting of six identical sides 311, 312, 313, 314, 315 and 316 meeting at a circular top surface section 34.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising one or more LED light sources and one or more diffusely transmissive covers, the one or more diffusely transmissive covers extending over the one or more LED light sources to form one or more combinations of an LED light source and a diffusely transmissive cover, wherein, for each combination of an LED light source and a diffusely transmissive cover:
   the diffusely transmissive cover is dome-shaped with a vertical cross-section having a closed convex shape and a horizontal cross-section having a polygonal shape,
   the diffusely transmissive cover has a width (w) projected in a horizontal plane parallel to a bottom of the diffusely transmissive cover, and
   the LED light source has a distance (d) to any neighboring LED light source,
   wherein the width (w) and the distance (d) are perpendicular to each other, and the ratio of the width (w) and the distance (d) is constant; and,
   wherein each diffusely transmissive cover comprises a wall with an apex, a bottom and a thickness, and wherein the thickness is largest at the apex.

2. The light emitting device according to claim 1, wherein each of the diffusely transmissive covers comprises a wall with a thickness, and wherein the thickness varies with the height of the wall and/or over the circumference of the wall.

3. The light emitting device according to claim 1, wherein each of the diffusely transmissive covers comprises a wall with a top section, a bottom section and a thickness, and wherein the thickness is larger at the top section than at the bottom section.

4. The light emitting device according to claim 3, wherein the thickness of the wall at the bottom section is in a range of 0.4 millimeters to 1.2 millimeters, and wherein the thickness of the wall at the top section is in a range of 1.5 millimeters to 4 millimeters.

5. The light emitting device according to claim 1, wherein for each diffusely transmissive cover the thickness is smallest at the bottom.

6. The light emitting device according to claim 1, wherein the horizontal cross section is quadrilateral, pentagonal or hexagonal.

7. The light emitting device according to claim 1, wherein the vertical cross-section is spline-shaped, elliptical, triangular or hemi-ellipsoid.

8. The light emitting device according to claim 1, wherein the diffusely transmissive covers (3) are pyramid-shaped or hemi-ellipsoid.

9. The light emitting device according to claim 1, wherein, for each combination of an LED light source and a diffusely transmissive cover, the horizontal cross section of the diffusely transmissive cover conforms to the shape of a base of the LED light source.

10. The light emitting device according to claim 1, wherein each diffusely transmissive cover is made of a glass material or of a plastic material.

11. The light emitting device according to claim 1, wherein the light emitting device is configured to be used as a light emitting wall panel or a light emitting ceiling panel.

12. A light emitting panel comprising the light emitting device according to claim 1.

* * * * *